US012772404B2

(12) United States Patent
Nishiyama

(10) Patent No.: US 12,772,404 B2
(45) Date of Patent: Oct. 20, 2026

(54) ELECTRONIC COMPONENT UNIT AND MANUFACTURING METHOD THEREOF

(71) Applicant: HONDA MOTOR CO., LTD., Tokyo (JP)

(72) Inventor: Kosuke Nishiyama, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 168 days.

(21) Appl. No.: 18/974,323

(22) Filed: Dec. 9, 2024

(65) Prior Publication Data

US 2025/0234471 A1 Jul. 17, 2025

(30) Foreign Application Priority Data

Jan. 17, 2024 (JP) ................................ 2024-005640

(51) Int. Cl.

| | |
|---|---|
| ***H05K 5/06*** | (2006.01) |
| ***B64D 31/16*** | (2024.01) |
| ***H02K 11/30*** | (2016.01) |
| ***H05K 5/02*** | (2006.01) |

(52) U.S. Cl.

CPC ............ *H05K 5/065* (2013.01); *B64D 31/16* (2024.01); *H02K 11/30* (2016.01); *H05K 5/0217* (2013.01); *H05K 5/0247* (2013.01)

(58) Field of Classification Search

None

See application file for complete search history.

(56) References Cited

U.S. PATENT DOCUMENTS

| | | | | |
|---|---|---|---|---|
| 9,385,571 | B2 * | 7/2016 | Honda | H02K 3/522 |
| 9,812,918 | B2 * | 11/2017 | Andrieux | H02K 5/225 |
| 10,181,658 | B2 * | 1/2019 | Neet | H02K 11/05 |
| 10,892,658 | B2 * | 1/2021 | Jang | H02K 1/2791 |
| 10,998,789 | B2 * | 5/2021 | Tategata | H02K 3/50 |
| 2011/0198121 | A1 * | 8/2011 | Matsumoto | H05K 5/30 174/549 |
| 2016/0013691 | A1 * | 1/2016 | Houzumi | H02K 3/522 310/208 |
| 2021/0143698 | A1 * | 5/2021 | Alsman | H02K 5/225 |
| 2021/0143699 | A1 * | 5/2021 | Alsman | H02K 3/28 |
| 2023/0006494 | A1 * | 1/2023 | D'Amico | H02K 3/50 |
| 2023/0098997 | A1 * | 3/2023 | Fiederling | H02K 1/146 310/71 |
| 2024/0105363 | A1 * | 3/2024 | Wrobel | H02G 5/025 |
| 2024/0223031 | A1 * | 7/2024 | Imai | H02K 1/18 |

FOREIGN PATENT DOCUMENTS

JP 2019170015 A 10/2019

* cited by examiner

*Primary Examiner* — Xanthia C Relford

(74) *Attorney, Agent, or Firm* — Armstrong Teasdale LLP

(57) ABSTRACT

An electronic component unit integrates a plurality of electronic components. The electronic component unit includes, a plurality of electronic components, a case that accommodates the plurality of electronic components, a mold material with which an inside of the case is filled and that seals the plurality of electronic components, and at least one bus bar connected to each of the electronic components. The case includes a case body that supports the plurality of electronic components, and at least one wall body formed separately from the case body and attached to the case body, and the bus bar penetrates through a gap between the case body and the wall body.

10 Claims, 13 Drawing Sheets

ELECTRONIC COMPONENT UNIT AND MANUFACTURING METHOD THEREOF

TECHNICAL FIELD

The present invention relates to an electronic component unit and a manufacturing method thereof.

BACKGROUND ART

In recent years, efforts to realize a low-carbon or carbon-free society have been gaining momentum, and research and development of electrification technologies is being conducted for vehicles, aircrafts, and the like to reduce $CO_2$ emissions and improve energy efficiency.

As the abovementioned research and development of electrification technologies, research and development of an electronic component unit that integrates a plurality of electronic components is being conducted. For example, JP2019-170015A discloses an electronic component unit (circuit element unit) that includes a plurality of electronic components (circuit elements), a case that accommodates the plurality of electronic components, a mold material (mold resin) with which an inside of the case is filled, and a bus bar that is connected to each of the electronic components.

In JP2019-170015A, the bus bar is pulled out from the case so as to bypass the case (see FIGS. 1 and 2 of JP2019-170015A). Accordingly, the bus bar becomes longer and the weight of the bus bar increases. Further, since the bus bar bypasses the case, the bus bar can only be pulled out from a side on which the case is opened. Accordingly, the restriction on the connection position between the bus bar and the connection target component arranged outside the case becomes severe.

SUMMARY OF THE INVENTION

In view of the above background, an object of the present invention is to shorten the bus bar and reduce the weight thereof while increasing the flexibility of the connection position between the bus bar and the connection target component arranged outside the case.

To achieve such an object, one aspect of the present invention provides an electronic component unit (79) that integrates a plurality of electronic components (147), the electronic component unit comprising: a plurality of electronic components; a case (148) that accommodates the plurality of electronic components; a mold material (149) with which an inside of the case is filled and that seals the plurality of electronic components; and at least one bus bar (150 and 151) connected to each of the electronic components, wherein the case includes: a case body (153) that supports the plurality of electronic components; and at least one wall body (154) formed separately from the case body and attached to the case body, and the bus bar penetrates through a gap (G) between the case body and the wall body.

According to this aspect, the bus bar can be pulled out through the gap of the case. Accordingly, as compared to a case where the bus bar bypasses the case, the bus bar can be made shorter and lighter. Further, by adjusting the position of the gap of the case, it is possible to pull out the bus bar from a desired position of the case. Accordingly, the flexibility of the connection position between the bus bar and the connection target component arranged outside the case can be improved.

In the above aspect, preferably, the case body is provided with a notch (166), and the wall body has a shape corresponding to the notch and engages with the notch.

According to this aspect, the wall body can be easily attached to the case body.

In the above aspect, preferably, the at least one bus bar comprises a plurality of bus bars arranged to gather at a position corresponding to the notch, the notch includes: a pair of side edges (167) facing each other; and a bottom edge (168) connecting the pair of side edges, the wall body includes: a pair of side portions (170) that engages with the pair of side edges; and a bottom portion (171) connecting the pair of side portions, and the plurality of bus bars penetrates through the gap between the bottom edge and the bottom portion.

According to this aspect, the gap through which the plurality of bas bars penetrates collectively can be easily formed.

In the above aspect, preferably, the case further includes a holding body (155) formed separately from the case body and the wall body and holding the bus bar, and the holding body fills at least a portion of the gap and surrounds a portion of the bus bar that penetrates through the gap.

According to this aspect, the holding body holding the bus bar surrounds the bus bar and fills the gap, so that the mold material with which the inside of the case is filled can be prevented from leaking out of the gap.

In the above aspect, preferably, the holding body includes: a flat base plate (173); a plurality of first ribs (174) protruding from one surface of the base plate and arranged at an interval in a first direction; and a second rib (175) facing the one surface of the base plate at an interval, extending in the first direction, and connecting the plurality of first ribs, and the base plate, the plurality of first ribs, and the second rib surround the portion of the bus bar that penetrates through the gap.

According to this aspect, the holding body with a simple configuration can surround the bus bar.

In the above aspect, preferably, the plurality of first ribs extends in a second direction perpendicular to the first direction, and a holding groove (176) that holds the bus bar is formed between the plurality of first ribs on the one surface of the base plate.

According to this aspect, the holding body can stably hold the bus bar.

In the above aspect, preferably, an engagement groove (171A) is formed on the wall body along the first direction, and the second rib engages with the engagement groove.

According to this aspect, the mold material with which the inside of the case is filled can be prevented from leaking from the space between the wall body and the holding body.

In the above aspect, preferably, the at least one wall body comprises a plurality of wall bodies provided at positions corresponding to the plurality of electronic components, and the at least one bus bar comprises a plurality of bas bars provided at the positions corresponding to the plurality of electronic components, and each of the bas bars penetrates through the gap between the case body and each of the wall bodies.

According to this aspect, even if the electronic component unit becomes large due to the integration of many electronic components, the bus bars can be pulled out from the case at positions corresponding to the electronic components. Accordingly, the design flexibility of the electronic component unit can be improved.

In the above aspect, preferably, the plurality of electronic components each has a cylindrical shape and is arranged adjacently to each other, the case body is bent to protrude toward one side in a width direction of the case body as viewed in an axial direction of the plurality of electronic components, and the plurality of wall bodies is attached to a wall (161) of the case body on the one side in the width direction of the case body.

According to this aspect, the plurality of bus bars can be pulled out toward the one side in the width direction of the case body (the side toward which the case body protrudes). Accordingly, in a case where a plurality of connection target components is arranged on the one side in the width direction of the case body, the plurality of bas bars can be easily connected to the plurality of connection target components.

To achieve such an object, one aspect of the present invention provides a manufacturing method of an electronic component unit (79), the electronic component unit comprising: a plurality of electronic components (147); at least one bus bar (150) connected to each of the electronic components; and a case (148) that accommodates the plurality of electronic components and includes: a case body (153) provided with a notch (166); and at least one wall body (154) engaging with the notch, the manufacturing method comprising the sequential steps of: placing the bus bar on the case body such that the bus bar crosses the notch, engaging the wall body with the notch such that the bus bar penetrates through a gap (G) between the notch and the wall body, and sealing the plurality of electronic components with a mold material (149) by filling an inside of the case with the mold material.

According to this aspect, the bus bar can be pulled out through the gap of the case. Accordingly, as compared to a case where the bus bar bypasses the case, the bus bar can be made shorter and lighter. Further, by adjusting the position of the gap of the case, it is possible to pull out the bus bar from a desired position of the case. Accordingly, the flexibility of the connection position between the bus bar and the connection target component arranged outside the case can be improved. Further, by placing the bus bar on the case body before engaging the wall body with the notch, it is possible to easily place the bus bar on the case body while checking the position of the bus bar. Accordingly, the manufacture of the electronic component unit can be facilitated.

Thus, according to the above aspects, it is possible to shorten the bus bar and reduce the weight thereof while increasing the flexibility of the connection position between the bus bar and the connection target component arranged outside the case.

BRIEF DESCRIPTION OF THE DRAWING(S)

DETAILED DESCRIPTION OF THE INVENTION

<The Aircraft 1>

In the following, an aircraft 1 (an example of a mobile body) according to an embodiment of the present invention will be described with reference to the drawings.

Figure 1:
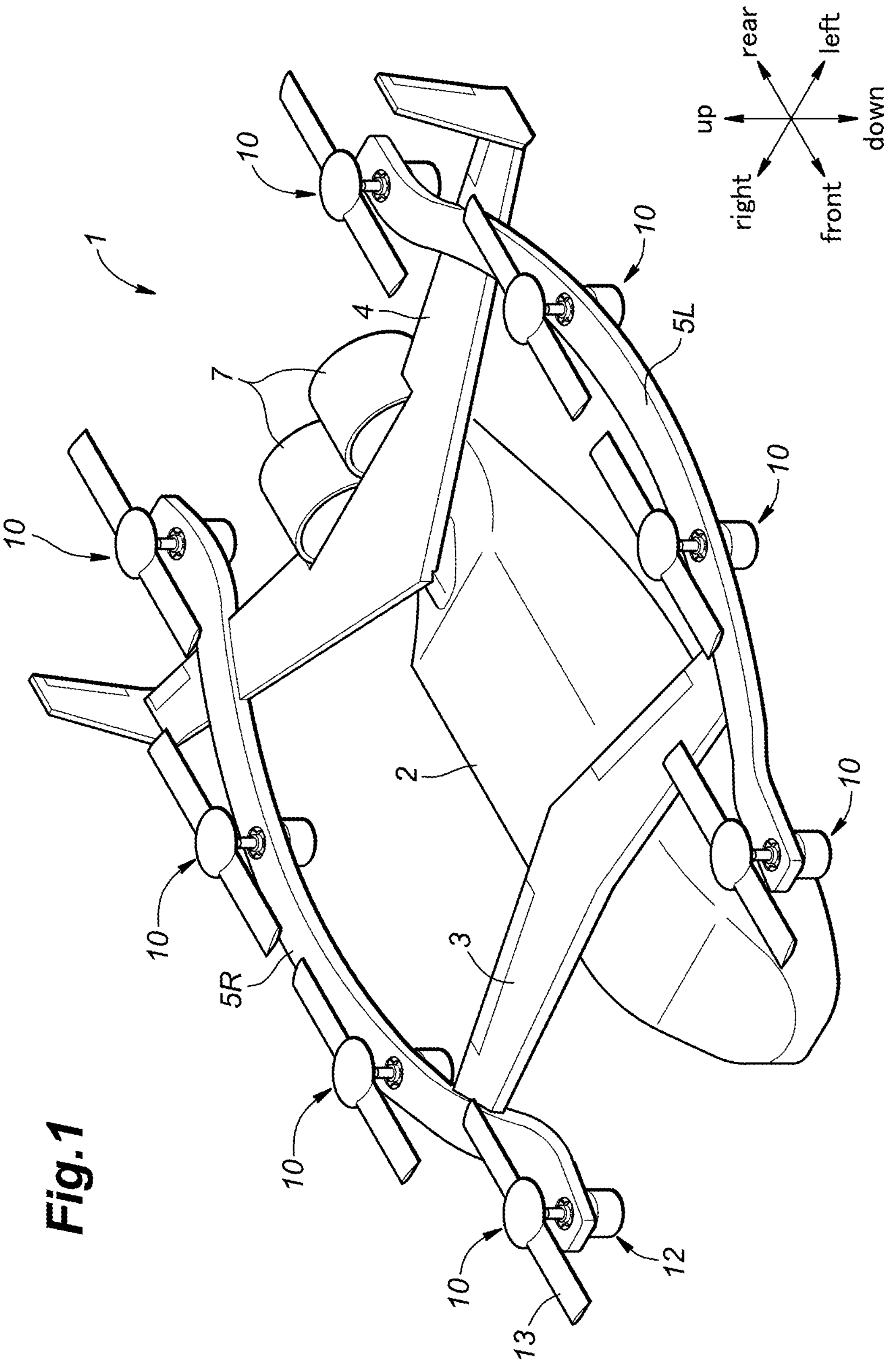
FIG. 1 is a perspective view of an aircraft according to an embodiment.

With reference to FIG. 1, the aircraft 1 is an electric vertical take-off and landing aircraft (eVTOL aircraft) capable of taking off and landing vertically. The aircraft 1 includes a body 2 extending in the front-and-rear direction, a front wing 3 extending in the lateral direction and connected to the front portion of the body 2, a rear wing 4 extending in the lateral direction and connected to the rear portion of the body 2, a left arm 5L extending in the front-and-rear direction and connecting the left end of the front wing 3 to the left side portion of the rear wing 4, and a right arm 5R extending in the front-and-rear direction and connecting the right end of the front wing 3 to the right side portion of the rear wing 4.

A cabin (not shown) for an occupant to board is provided in the front portion of the body 2. Left and right propulsion units 7 (which will be described later) for applying the forward propulsion force to the aircraft 1 are provided at the rear end of the body 2. The propulsion units 7 may also be called "cruise units".

The left arm 5L and the right arm 5R are each provided with a plurality of (for example, four) lift units 10 for applying the ascending and descending forces to the aircraft 1. The plurality of lift units 10 is arranged at intervals in the front-and-rear direction. The lift units 10 may also be called "vertical take-off and landing (VTOL) units". Each lift unit 10 includes a lift drive device 12 and a lift rotor 13 attached to the lift drive device 12. The lift drive device 12 includes an electric motor (not shown), and is configured to rotate the lift rotor 13 by the driving force of the electric motor.

<The Propulsion Unit 7>

Figure 2:
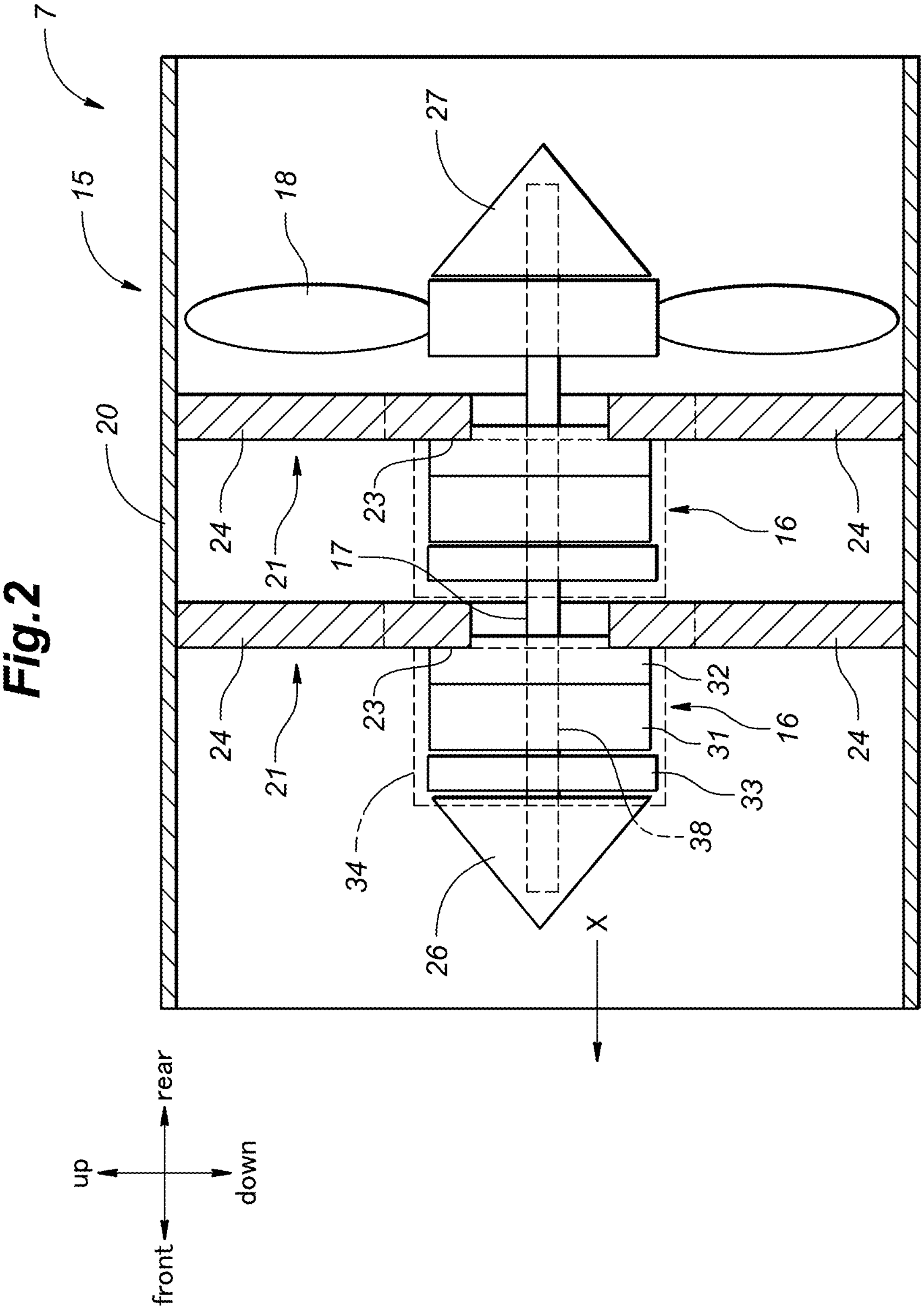
FIG. 2 is a partial cross-sectional view showing a propulsion unit according to the embodiment.

With reference to FIG. 2, each propulsion unit 7 includes a support body 15, front and rear propulsion drive devices 16 (an example of electric drive devices) supported by the support body 15, a rotation shaft 17 extending in the front-and-rear direction and rotatably supported by the front and rear propulsion drive devices 16, and a propulsion rotor 18 fixed to the rear portion of the rotation shaft 17.

The support body 15 is fixed to the rear end of the body 2 (see FIG. 1). The support body 15 includes a cylindrical nacelle 20 extending in the front-and-rear direction, and front and rear mount frames 21 fixed to the inner circumferential surface of the nacelle 20. Each mount frame 21 includes an annular hub 23 that is concentric with the nacelle 20, and a plurality of spokes 24 extending radially from the outer circumferential surface of the hub 23 and connected to the inner circumferential surface of the nacelle 20.

The front and rear propulsion drive devices 16 are accommodated in the nacelle 20. The front and rear propulsion drive devices 16 are fixed to the front surface of the hub 23 of the front and rear mount frames 21, respectively. The details of each propulsion drive device 16 will be described later.

The rotation shaft 17 is accommodated in the nacelle 20. The rotation shaft 17 penetrates through the hub 23 of each mount frame 21. A conical front cover 26 the diameter of which increases toward the rear is fixed to the front end of the rotation shaft 17. The front cover 26 is arranged in front of the front propulsion drive device 16. A conical rear cover 27 the diameter of which increases toward the front is fixed to the rear end of the rotation shaft 17. The rear cover 27 is arranged behind the central portion of the propulsion rotor 18.

The propulsion rotor 18 is accommodated in the nacelle 20. The propulsion rotor 18 is configured to rotate integrally with the rotation shaft 17 according to the rotation of the rotation shaft 17, thereby applying the forward propulsion force to the aircraft 1.

<The Propulsion Drive Device 16>

Figure 3:
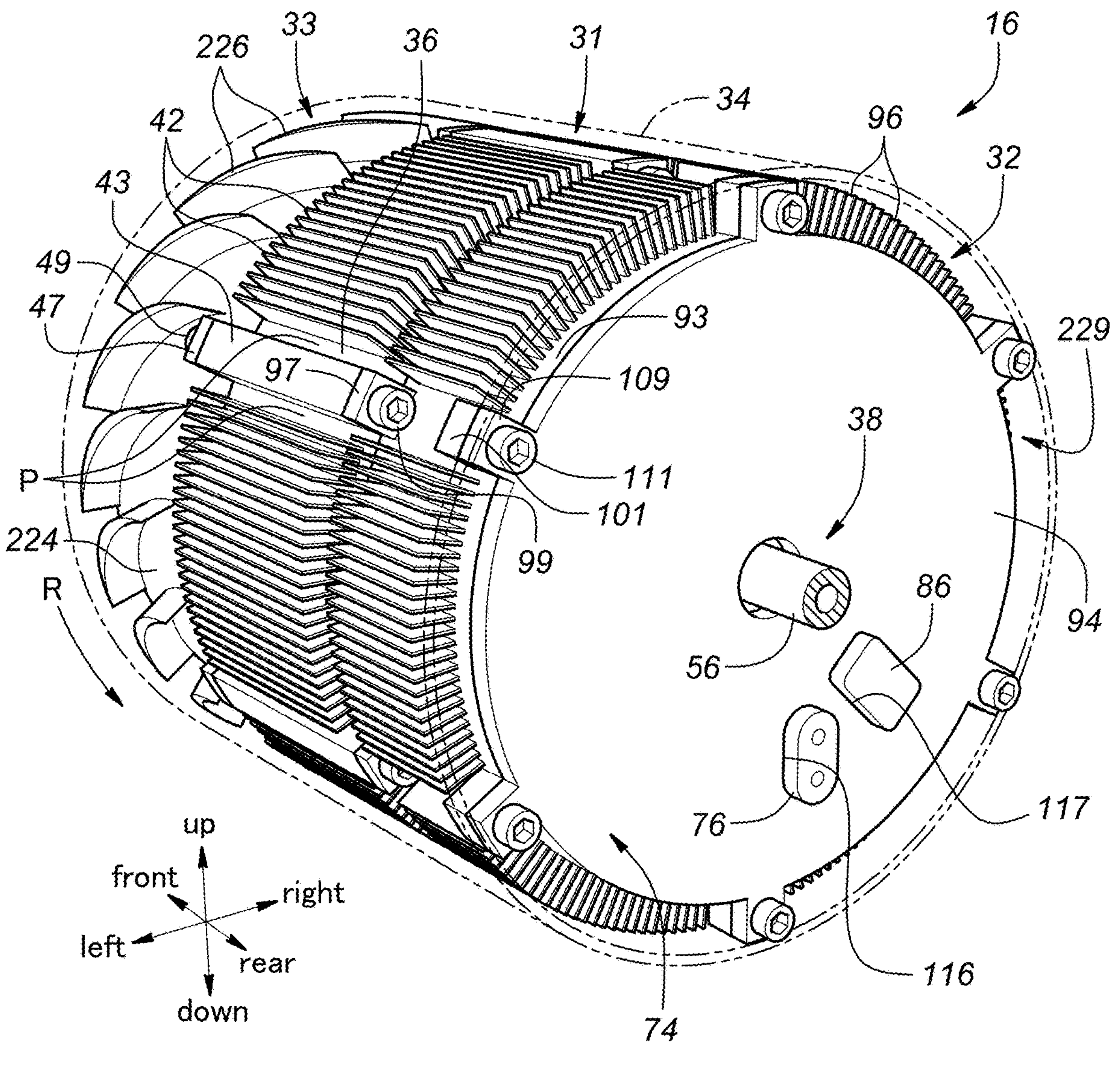
FIG. 3 is a perspective view showing a propulsion drive device according to the embodiment.
Figure 4:
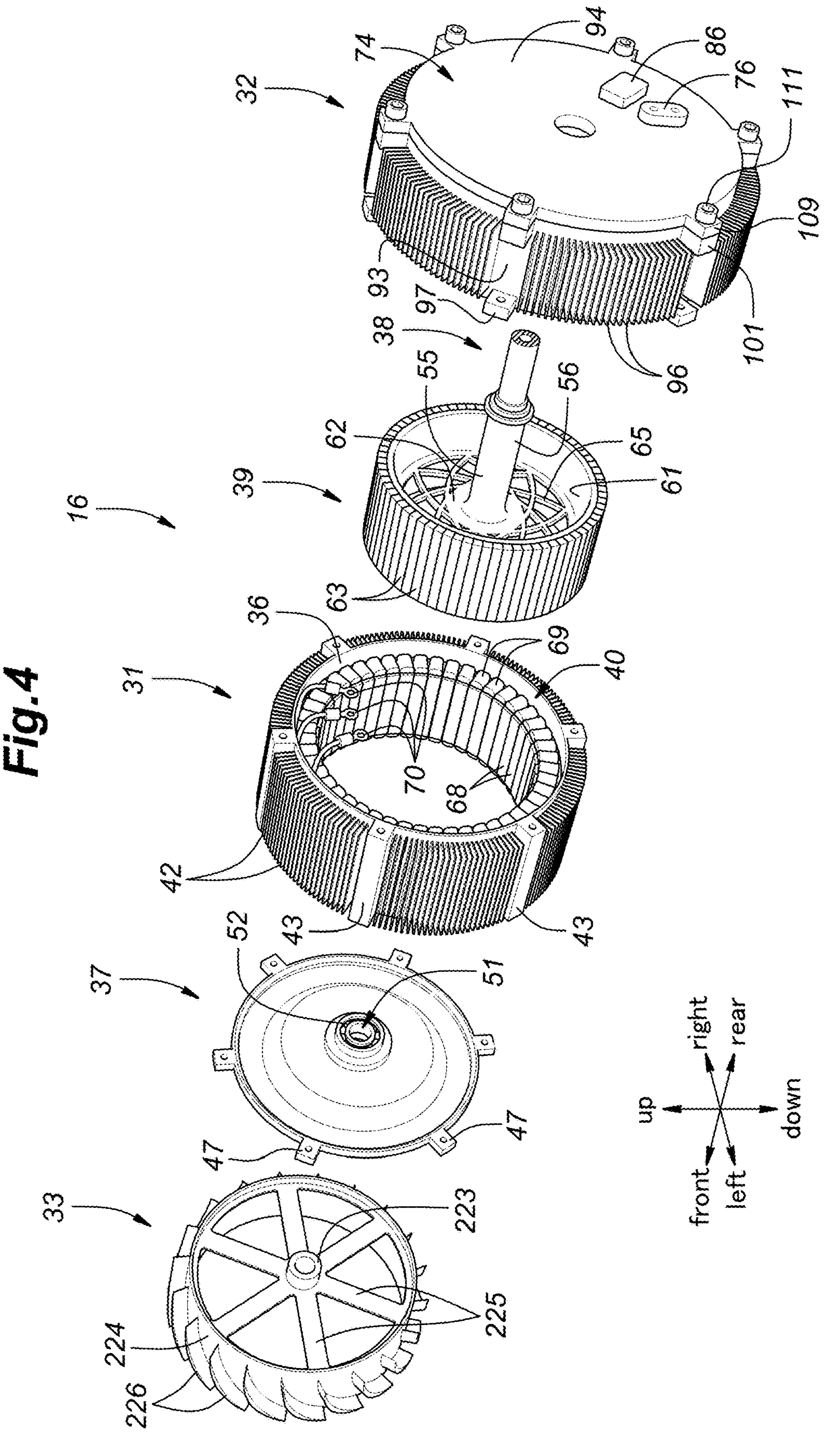
FIG. 4 is an exploded perspective view showing the propulsion drive device according to the embodiment.

With reference to FIGS. 2 and 3, each propulsion drive device 16 includes an electric motor 31 (an example of a rotary electric machine), a controller 32 arranged on the rear side of the electric motor 31, a fan 33 arranged on the front side of the electric motor 31, and a duct cover 34 that covers the outer circumference of the electric motor 31, the controller 32, and the fan 33. In FIG. 4, the duct cover 34 is omitted.

<The Electric Motor 31>

Figure 5:
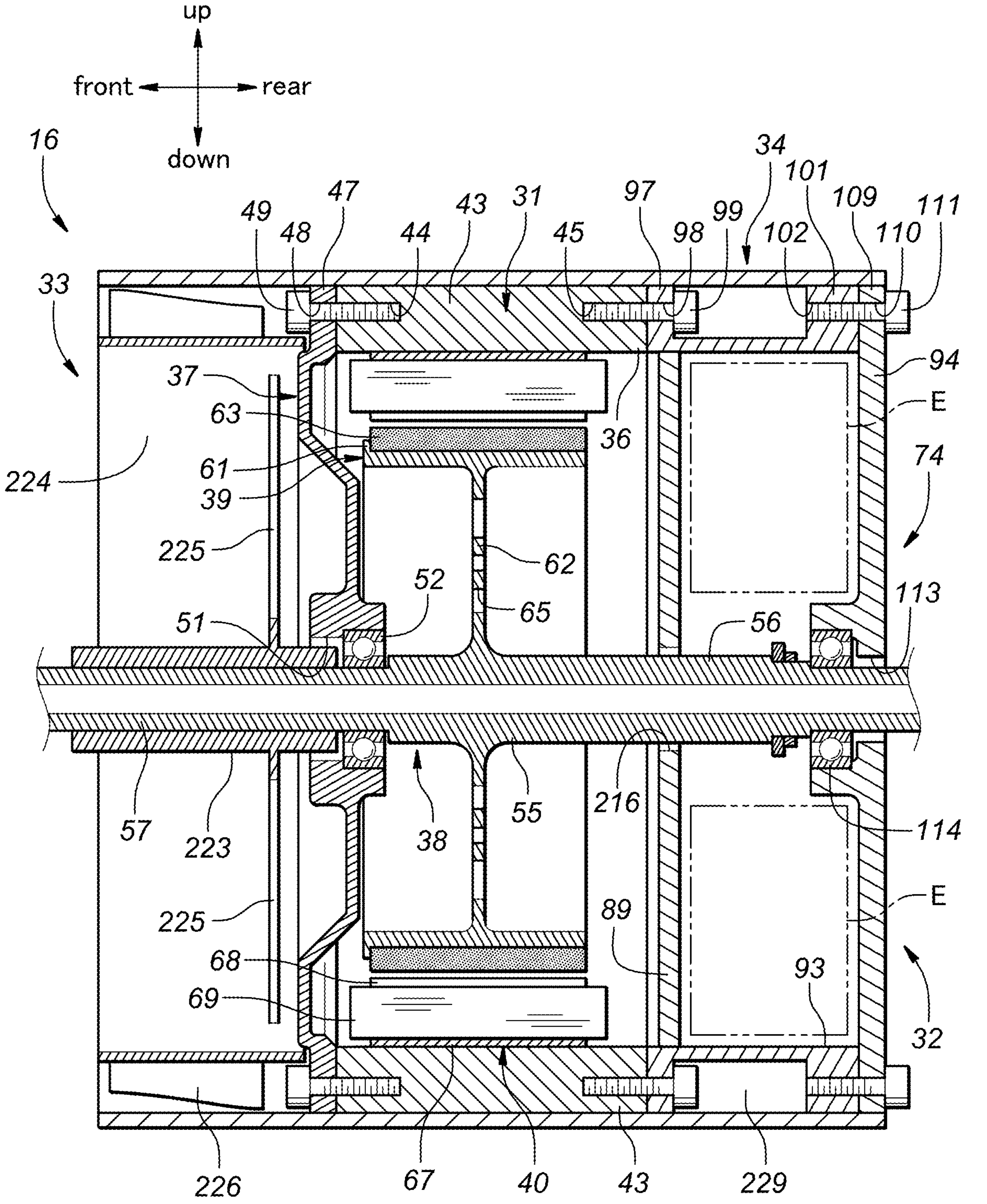
FIG. 5 is a cross-sectional view showing the propulsion drive device according to the embodiment.

With reference to FIGS. 4 and 5, the electric motor 31 is sandwiched between the controller 32 and the fan 33. For example, the electric motor 31 is a three-phase AC motor of an inner rotor type. The electric motor 31 includes a housing 36, a lid 37, a shaft 38, a rotor 39, and a stator 40.

The housing 36 is cylindrical and extends in the front-and-rear direction on the outer circumference of the shaft 38. The housing 36 is arranged on the outer circumference of the rotor 39 and the stator 40 and accommodates the rotor 39 and the stator 40 (an example of structural components of the electric motor 31).

A plurality of first cooling fins 42 protrudes from the outer circumferential surface of the housing 36 at intervals in the circumferential direction of the housing 36. The plurality of first cooling fins 42 is formed integrally with the housing 36. Each first cooling fin 42 has a flat plate shape and extends along the front-and-rear direction. Each first cooling fin 42 extends continuously from the front end (one end in the front-and-rear direction) of the housing 36 to the rear end (the other end in the front-and-rear direction) thereof.

A plurality of fastening protrusions 43 protrudes from the outer circumferential surface of the housing 36 at intervals in the circumferential direction of the housing 36. The plurality of fastening protrusions 43 is provided between adjacent first cooling fins 42. Passages P of the cooling air that extend continuously from the front end of the housing 36 to the rear end thereof are formed between the adjacent first cooling fins 42 and each fastening protrusion 43. The plurality of fastening protrusions 43 is formed integrally with the housing 36.

Each fastening protrusion 43 is a rod-shaped portion with a rectangular cross-section and extends along the front-and-rear direction. That is, each fastening protrusion 43 extends parallel to each first cooling fin 42. Each fastening protrusion 43 extends continuously from the front end (one end in the front-and-rear direction) of the housing 36 to the rear end (the other end in the front-and-rear direction) thereof. Each fastening protrusion 43 is integrally formed of the same material from the front end (one end in the front-and-rear direction) of each fastening protrusion 43 to the rear end (the other end in the front-and-rear direction) thereof.

The front end of each fastening protrusion 43 is provided with a first bolt hole 44 for fastening the lid 37 to the housing 36. The rear end of each fastening protrusion 43 is provided with a second bolt hole 45 for fastening a casing 74 of the controller 32 (which will be described later) to the housing 36. The first bolt hole 44 and the second bolt hole 45 extend along the front-and-rear direction.

The lid 37 is adjacent to the housing 36 and closes the opening of the housing 36 on the front side (the side opposite to the controller 32). The lid 37 is a disk-shaped member and extends along a plane perpendicular to the front-and-rear direction. The lid 37 is formed separately from the housing 36. In another embodiment, the lid 37 may be formed integrally with the housing 36.

A plurality of first fastening pieces 47 protrudes from the outer circumferential portion of the lid 37 at intervals in the circumferential direction of the lid 37. Each first fastening piece 47 is provided with a first fastening hole 48 formed in the front-and-rear direction. The lid 37 is fastened to the housing 36 as a first fastening bolt 49 penetrating through the first fastening hole 48 engages with the first bolt hole 44 of each fastening protrusion 43 of the housing 36. A circular first through hole 51 is provided in the front-and-rear direction in the central portion of the lid 37. A first bearing 52 is attached to the first through hole 51.

With reference to FIG. 2, the shaft 38 extends in the front-and-rear direction (an example of the prescribed axial direction). The shaft 38 constitutes a portion of the rotation shaft 17 of the propulsion unit 7. Accordingly, as the shaft 38 rotates, the entire rotation shaft 17 rotates, and the propulsion rotor 18 rotates integrally with the rotation shaft 17. This applies the forward propulsion force to the aircraft 1, thereby propelling the aircraft 1 forward. The shaft 38 extends along the propulsion direction of the aircraft 1 (see an arrow X in FIG. 2).

With reference to FIG. 5, the shaft 38 is hollow. The shaft 38 includes a main body 55 accommodated in the housing 36, an extending portion 56 extending from the main body 55 toward the rear side (toward the controller 32), and a protruding portion 57 protruding from the main body 55 toward the front side (the side opposite to the controller 32). The protruding portion 57 penetrates through the first through hole 51 of the lid 37 and extends to the space on the front side of the electric motor 31. The protruding portion 57 is rotatably supported by the lid 37 via the first bearing 52.

With reference to FIGS. 4 and 5, the rotor 39 is hollow. The rotor 39 is arranged on the outer circumference of the main body 55 of the shaft 38. The rotor 39 includes a cylindrical rotor core 61 extending in the front-and-rear direction, a rotor plate 62 extending in the radial direction and connecting the main body 55 of the shaft 38 and the rotor core 61, and a plurality of permanent magnets 63 fixed to the outer circumferential surface of the rotor core 61. The rotor core 61 and the rotor plate 62 are formed integrally with the shaft 38. The rotor plate 62 is provided with a plurality of communication holes 65 penetrating therethrough in the front-and-rear direction.

The stator 40 is arranged on the outer circumference of the rotor 39 and faces the rotor 39 at a distance. The stator 40 includes a cylindrical stator core 67 extending in the front-and-rear direction, a plurality of teeth 68 protruding from the inner circumferential surface of the stator core 67, a plurality of coils 69 wound around the plurality of teeth 68, and three motor terminals 70 (an example of terminals of the rotary electric machine) connected to the plurality of coils 69. The stator core 67 is fixed to the inner circumferential surface of the housing 36. Among the components of the electric motor 31 and the controller 32, the plurality of coils 69 has the greatest heat generation. Accordingly, the heat generation of the electric motor 31 is greater than the heat generation of the controller 32. The three motor terminals 70 correspond to the U-phase, V-phase, and W-phase of the three-phase AC, respectively.

<The Controller 32>

With reference to FIGS. 3 and 4, the controller 32 is integrated with the electric motor 31 and configured to control driving of the electric motor 31. In other words, the propulsion drive device 16 according to the present embodiment is a drive device in which the controller 32 is integrated with the electric motor 31.

Figure 6:
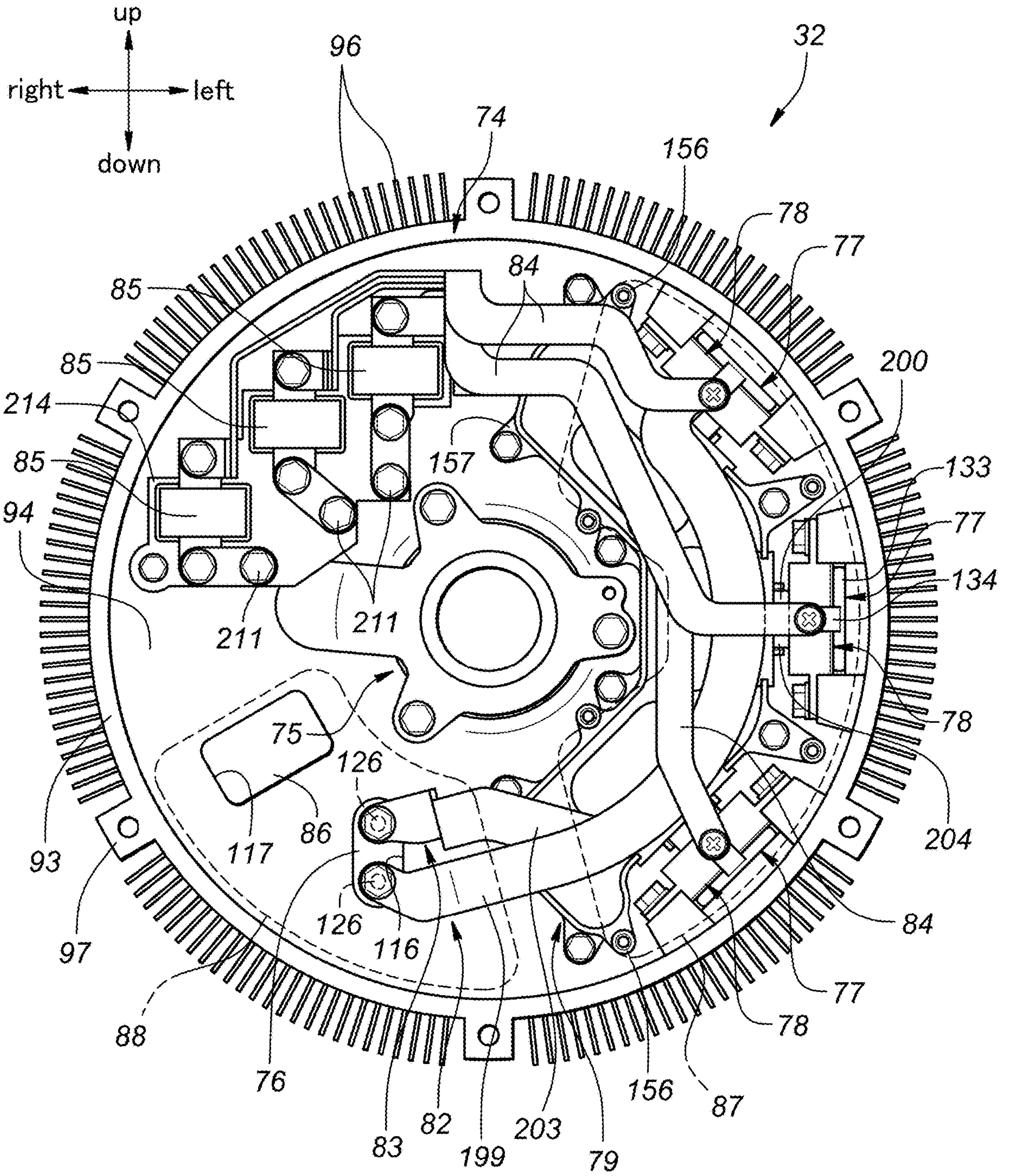
FIG. 6 is a front view showing a controller according to the embodiment.
Figure 7:
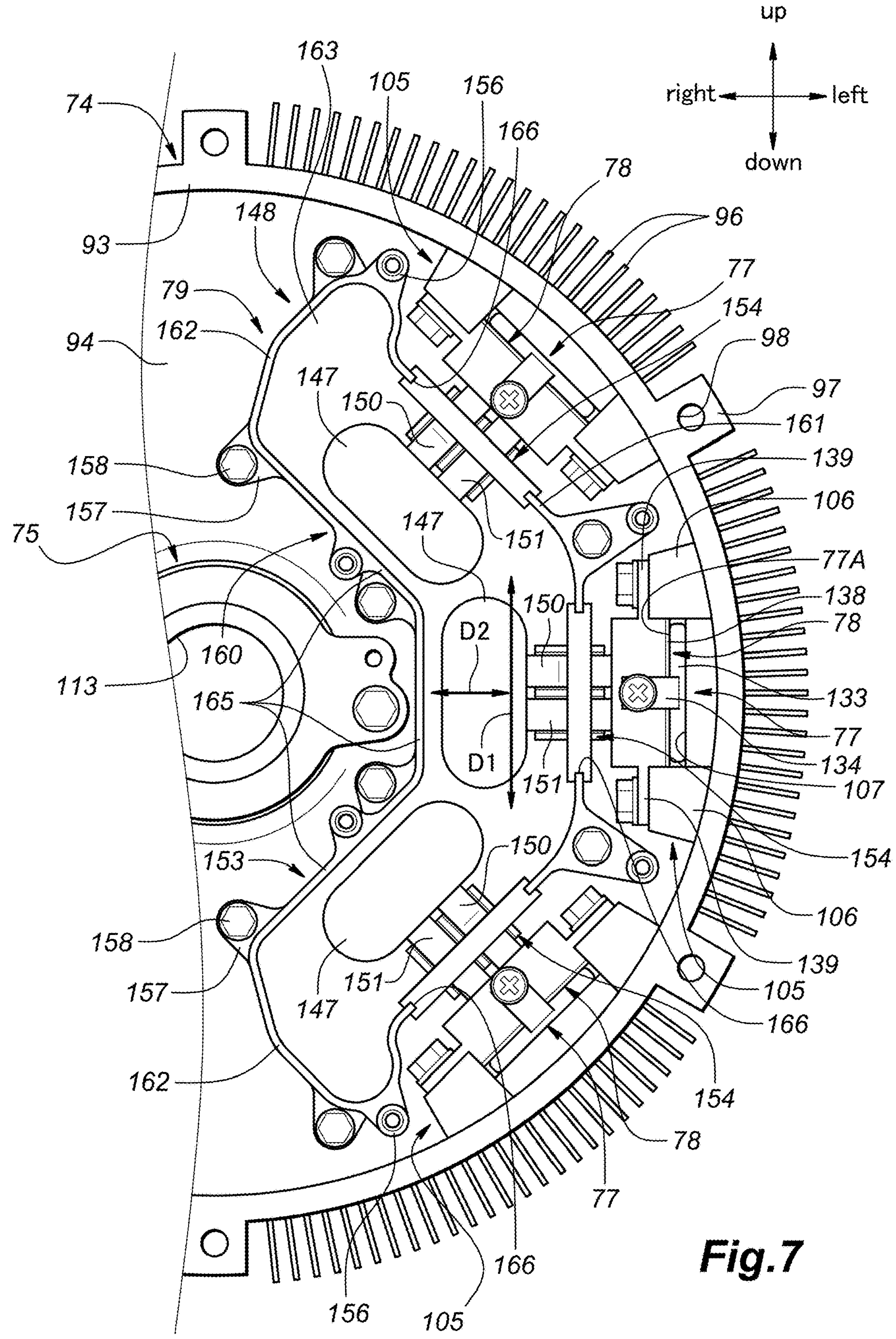
FIG. 7 is a front view showing a smoothing capacitor and its circumference according to the embodiment.

With reference to FIGS. 6 and 7, the controller 32 includes a casing 74, a resolver 75, a DC input connector 76, three power modules 77, three pressing members 78, a smoothing capacitor 79, first and second DC bus bars 82, 83, three AC bus bars 84, three electric current sensors 85, a communication connector 86, a drive board 87, a control board 88, and a separating member 89 (see FIG. 5). Further, in FIG. 5, structural components E (for example, the three power modules 77, the smoothing capacitor 79, the three electric current sensors 85, the drive board 87, and the control board 88) of the controller 32 are omitted, and only the outline of the structural components E is shown.

With reference to FIG. 5, the casing 74 is adjacent to the housing 36 of the electric motor 31. The casing 74 is made of metal and has a cylindrical shape with a bottom. The casing 74 accommodates the structural components E of the controller 32.

The casing 74 includes a cylindrical circumferential wall 93 extending in the front-and-rear direction on the outer circumference of the extending portion 56 of the shaft 38, and a bottom wall 94 closing the opening of the circumferential wall 93 on the rear side (the side opposite to the electric motor 31). Hereinafter, the term "circumferential direction" used in the description of the components of the controller 32 will refer to the circumferential direction of the circumferential wall 93 of the casing 74 (in other words, the circumferential direction centered on the extending portion 56 of the shaft 38), and the term "radial direction" used in the description of the components of the controller 32 will refer to the radial direction of the circumferential wall 93 of the casing 74 (in other words, the radial direction centered on the extending portion 56 of the shaft 38).

With reference to FIGS. 3 and 4, a plurality of second cooling fins 96 protrudes from the outer circumferential surface of the circumferential wall 93 of the casing 74 at intervals in the circumferential direction. The plurality of second cooling fins 96 is formed integrally with the circumferential wall 93. Each second cooling fin 96 has a flat plate shape and extends along the front-and-rear direction. Each second cooling fin 96 extends continuously from the front end (one end in the front-and-rear direction) of the circumferential wall 93 to the rear end (the other end in the front-and-rear direction) thereof.

With reference to FIGS. 3 and 5, a plurality of second fastening pieces 97 protrudes at intervals in the circumferential direction from the front end (the end on the side of the electric motor 31) of the outer circumferential surface of the circumferential wall 93 of the casing 74. Each second fastening piece 97 is provided with a second fastening hole 98 formed in the front-and-rear direction. The casing 74 is fastened to the housing 36 as a second fastening bolt 99 penetrating through the second fastening hole 98 engages with the second bolt hole 45 of each fastening protrusion 43 of the housing 36.

A plurality of third fastening pieces 101 protrudes at intervals in the circumferential direction from the rear end (the end opposite to the electric motor 31) of the outer circumferential surface of the circumferential wall 93 of the casing 74. Each third fastening piece 101 is provided with a third fastening hole 102 formed in the front-and-rear direction.

Figure 8:
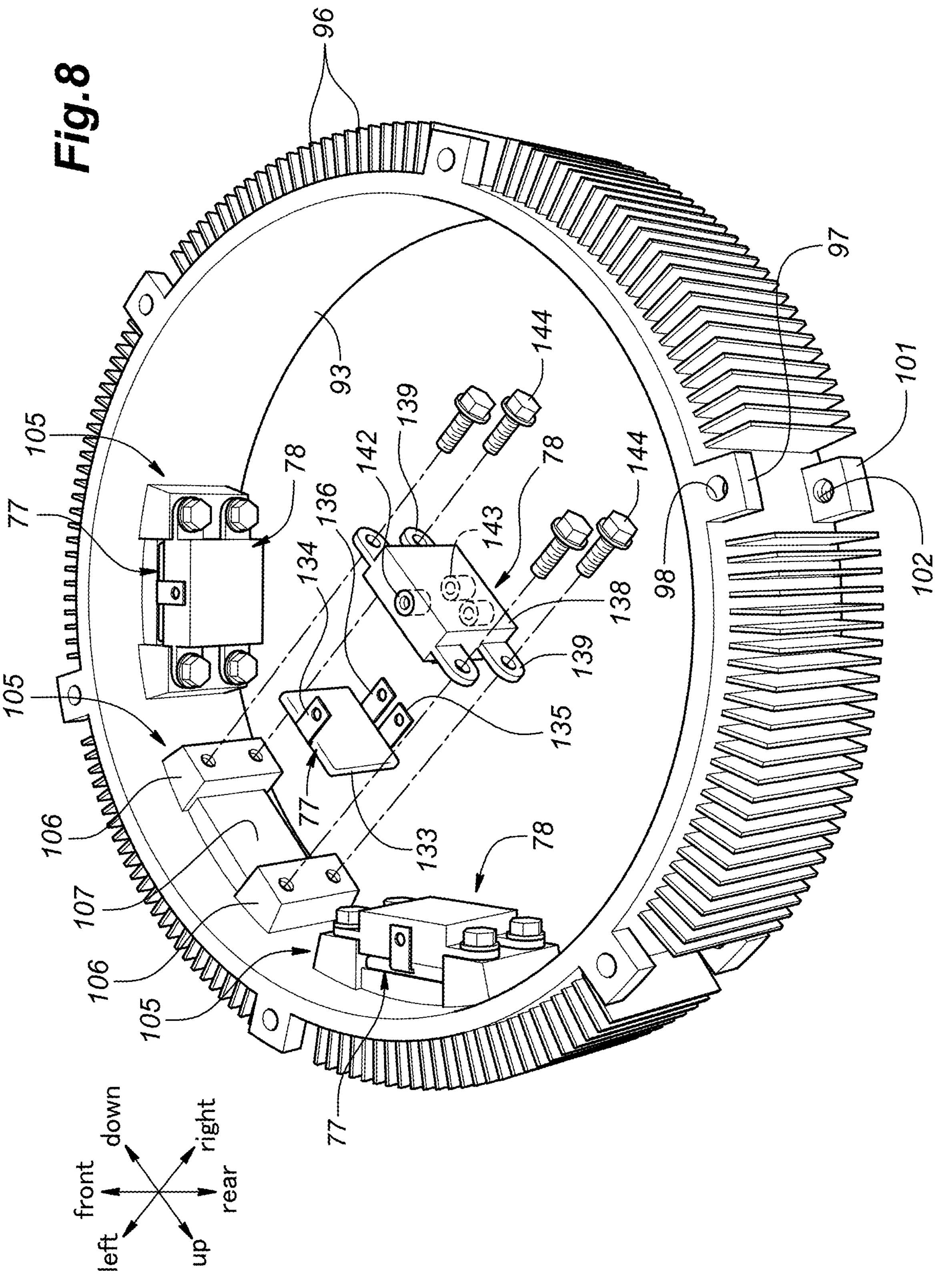
FIG. 8 is a perspective view showing fixing structures of power modules according to the embodiment.

With reference to FIGS. 7 and 8, three pedestals 105 protrude from the inner circumferential surface of the circumferential wall 93 of the casing 74 at intervals in the circumferential direction. A pair of fixing protrusions 106 protrudes from both side portions in the circumferential direction of the inner surface (the inside surface in the radial direction) of each pedestal 105. An engagement recess 107 is provided between the pair of fixing protrusions 106 and in the central portion in the circumferential direction of the inner surface of each pedestal 105. Two of the three pedestals 105 are arranged such that the position of one of the fixing protrusions 106 in the circumferential direction overlaps with the position of one of the second fastening pieces 97 in the circumferential direction, and the other of the fixing protrusions 106 is arranged between the second fastening pieces 97 such that the position of the other of the fixing protrusions 106 in the circumferential direction does not overlap with the positions of the second fastening pieces 97 in the circumferential direction.

With reference to FIGS. 5 and 6, the bottom wall 94 of the casing 74 is a disk-shaped portion and extends along a plane perpendicular to the front-and-rear direction. The bottom wall 94 is formed separately from the circumferential wall 93. In another embodiment, the bottom wall 94 may be formed integrally with the circumferential wall 93.

A plurality of fourth fastening pieces 109 protrudes from the outer circumferential portion of the bottom wall 94 of the casing 74 at intervals in the circumferential direction. Each fourth fastening piece 109 is provided with a fourth fastening hole 110 formed in the front-and-rear direction. The bottom wall 94 is fastened to the circumferential wall 93 as a third fastening bolt 111 penetrating through the fourth fastening hole 110 engages with the third fastening hole 102 of each third fastening piece 101 of the circumferential wall 93.

A circular second through hole 113 is provided in the front-and-rear direction in the central portion of the bottom wall 94 of the casing 74. A second bearing 114 is attached to the second through hole 113. The extending portion 56 of the shaft 38 penetrates through the second through hole 113. The extending portion 56 of the shaft 38 is rotatably supported by the second through hole 113 via the second bearing 114. The lower portion of the bottom wall 94 is provided with a first fitting hole 116 and a second fitting hole 117 formed in the front-and-rear direction. The first fitting hole 116 and the second fitting hole 117 are provided at a distance from each other in the circumferential direction.

With reference to FIG. 6, the resolver 75 is fixed to the central portion of the bottom wall 94 of the casing 74. The resolver 75 includes a plurality of detection units (not shown) for detecting the rotation of the extending portion 56 of the shaft 38. The plurality of detection units are arranged at intervals in the circumferential direction.

Figure 9:
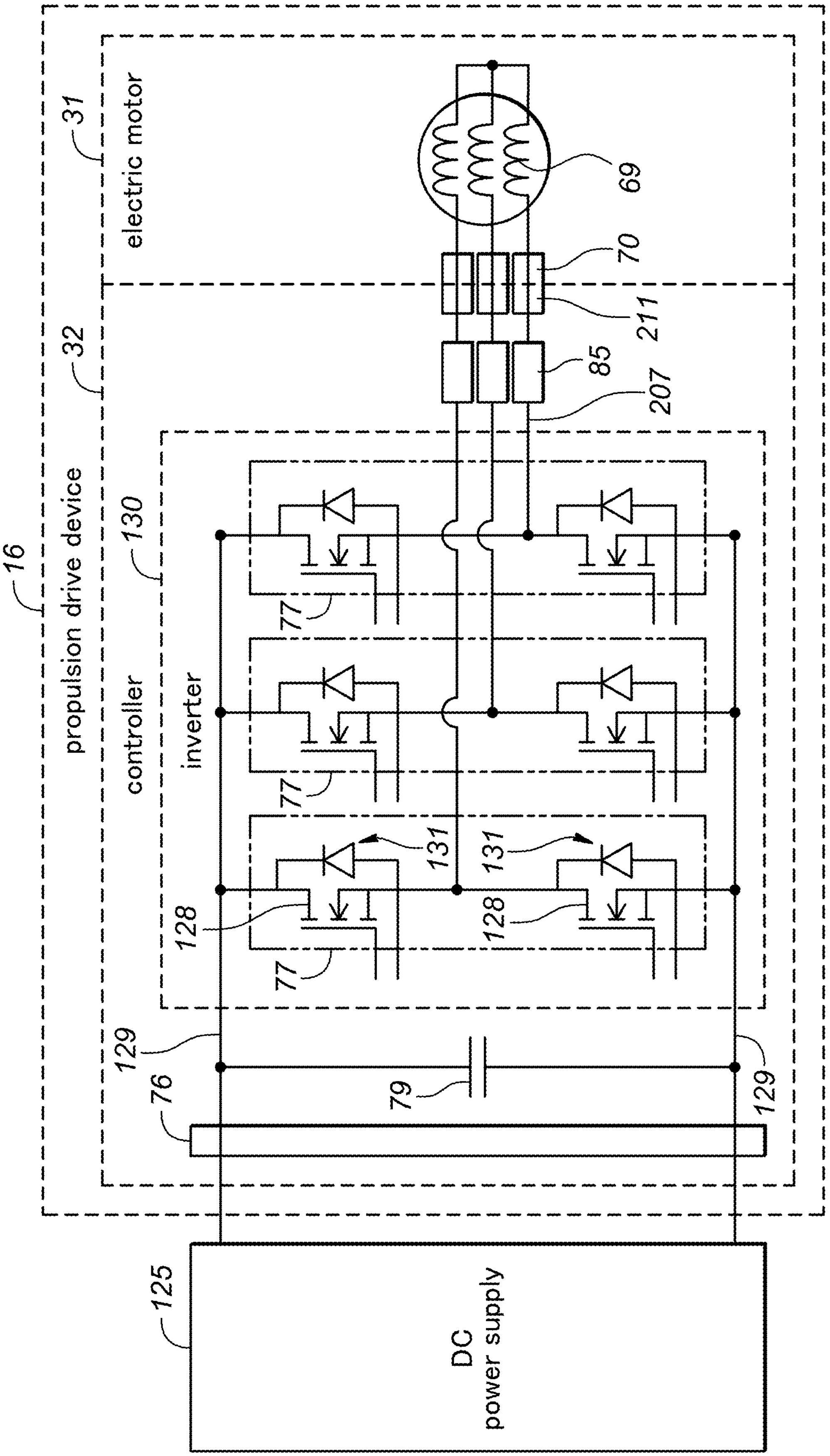
FIG. 9 is a circuit diagram showing a DC power supply and the propulsion drive device according to the embodiment.

With reference to FIG. 9, the DC input connector 76 is connected to a DC power supply 125 provided outside the propulsion drive device 16. For example, the DC power supply 125 may be composed of a battery or a generator.

With reference to FIGS. 3 and 6, the DC input connector 76 fits into the first fitting hole 116 of the bottom wall 94 of the casing 74 and penetrates through the bottom wall 94 of the casing 74. A pair of DC input terminals 126 is provided on the front surface (the surface on the side of the electric motor 31) of the DC input connector 76.

With reference to FIG. 9, the three power modules 77 each include two switching elements 128. That is, the controller 32 includes a total of six switching elements 128. The six switching elements 128 are components of an inverter 130 (an example of a power conversion circuit) that converts DC power (direct current) input from the DC power supply 125 via a pair of DC lines 129 into AC power (alternating current). Each switching element 128 is composed of a semiconductor element such as an IGBT or a MOSFET. Each switching element 128 is arranged in parallel with a freewheel diode 131.

With reference to FIGS. 7 and 8, the three power modules 77 are arranged at intervals in the circumferential direction and contact with the inner circumferential surface of the circumferential wall 93 of the casing 74. The positions of the three power modules 77 in the circumferential direction do not overlap with the positions of the plurality of second fastening pieces 97 (i.e., the fastening points of the casing 74 and the housing 36) in the circumferential direction, but overlap with the positions of the plurality of second cooling fins 96 in the circumferential direction. The three power modules 77 are arranged to avoid the uppermost portion of the casing 74. An arrow D1 appropriately shown in each drawing indicates a direction (hereinafter referred to as "the first direction D1") parallel to an inner surface 77A of each power module 77. An arrow D2 appropriately shown in each drawing indicates a direction (hereinafter referred to as "the second direction D2") perpendicular to the first direction D1 and the inner surface 77A of each power module 77.

Each power module 77 includes a flat module body 133, an AC module bus bar 134 extending from the front end (one end in the front-and-rear direction) of the module body 133 toward the inside in the radial direction, and a first DC module bus bar 135 and a second DC module bus bar 136 extending from the rear end (the other end in the front-and-rear direction) of the module body 133 toward the inside in the radial direction.

The three pressing members 78 are arranged at intervals in the circumferential direction. Each pressing member 78 includes a rectangular parallelepiped engagement piece 138 and a plurality of protruding pieces 139 protruding from the engagement piece 138 toward both sides in the circumferential direction. The engagement piece 138 engages with the engagement recess 107 of each pedestal 105 arranged on the inner circumferential surface of the circumferential wall 93 of the casing 74. The engagement piece 138 and the engagement recess 107 of each pedestal 105 sandwich the module body 133 of each power module 77. The engagement piece 138 presses the module body 133 of each power module 77 against the engagement recess 107 of each pedestal 105. An AC insert nut 142 is embedded in the front surface (the surface on one side in the front-and-rear direction) of the engagement piece 138. Two DC insert nuts 143 are embedded in the rear surface (the surface on the other side in the front-and-rear direction) of the engagement piece 138. Each protruding piece 139 is fixed to each fixing protrusion 106 of each pedestal 105 by a fixing bolt 144.

With reference to FIG. 9, the smoothing capacitor 79 is connected to the DC power supply 125 in parallel with the inverter 130. The smoothing capacitor 79 smooths the direct current input to the inverter 130 from the DC power supply 125. More specifically, the smoothing capacitor 79 protects the three power modules 77 by smoothing a pulse electric current (a pulse-shaped electric current caused by a surge voltage) generated in the direct current input from the DC power supply 125 to the three power modules 77.

With reference to FIG. 7, the smoothing capacitor 79 is arranged at an interval from the inner circumferential surface of the circumferential wall 93 of the casing 74. The smoothing capacitor 79 and the three power modules 77 are arranged in the left semicircular portion (an example of one semicircular portion) of the casing 74. The smoothing capacitor 79 is continuously arranged along the inner surfaces 77A of the three power modules 77 (more specifically, the inner surfaces in the radial direction of the module bodies 133 of the three power modules 77). Accordingly, as viewed from the front side (the side of the electric motor 31), the smoothing capacitor 79 and each power module 77 are arranged in order from the inside in the radial direction to the outside in the radial direction between the second through hole 113 of the bottom wall 94 of the casing 74 and the inner circumferential surface of the circumferential wall 93 of the casing 74.

Figure 10:
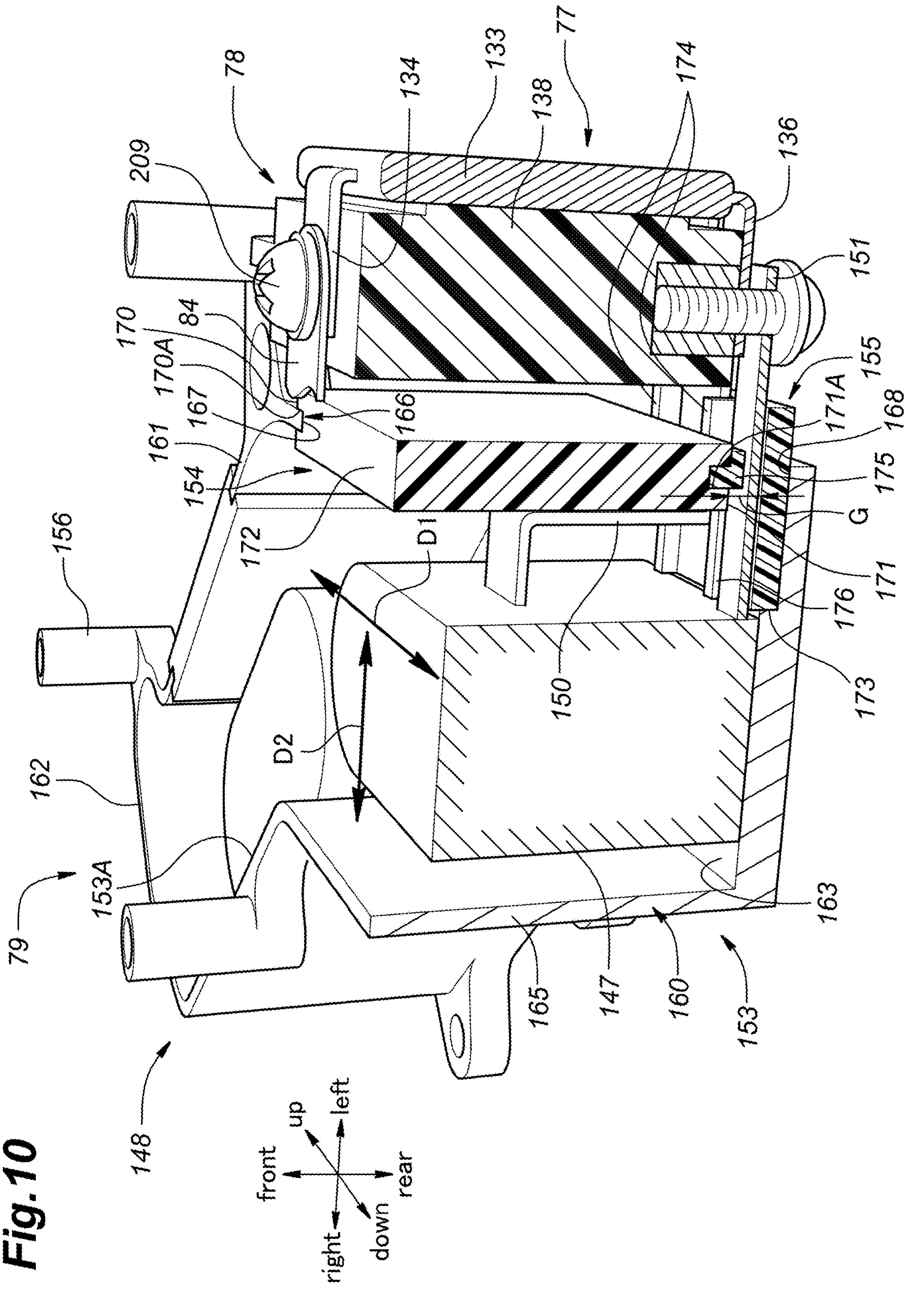
FIG. 10 is a perspective cross-sectional view showing the smoothing capacitor and its circumference according to the embodiment.
Figure 11:
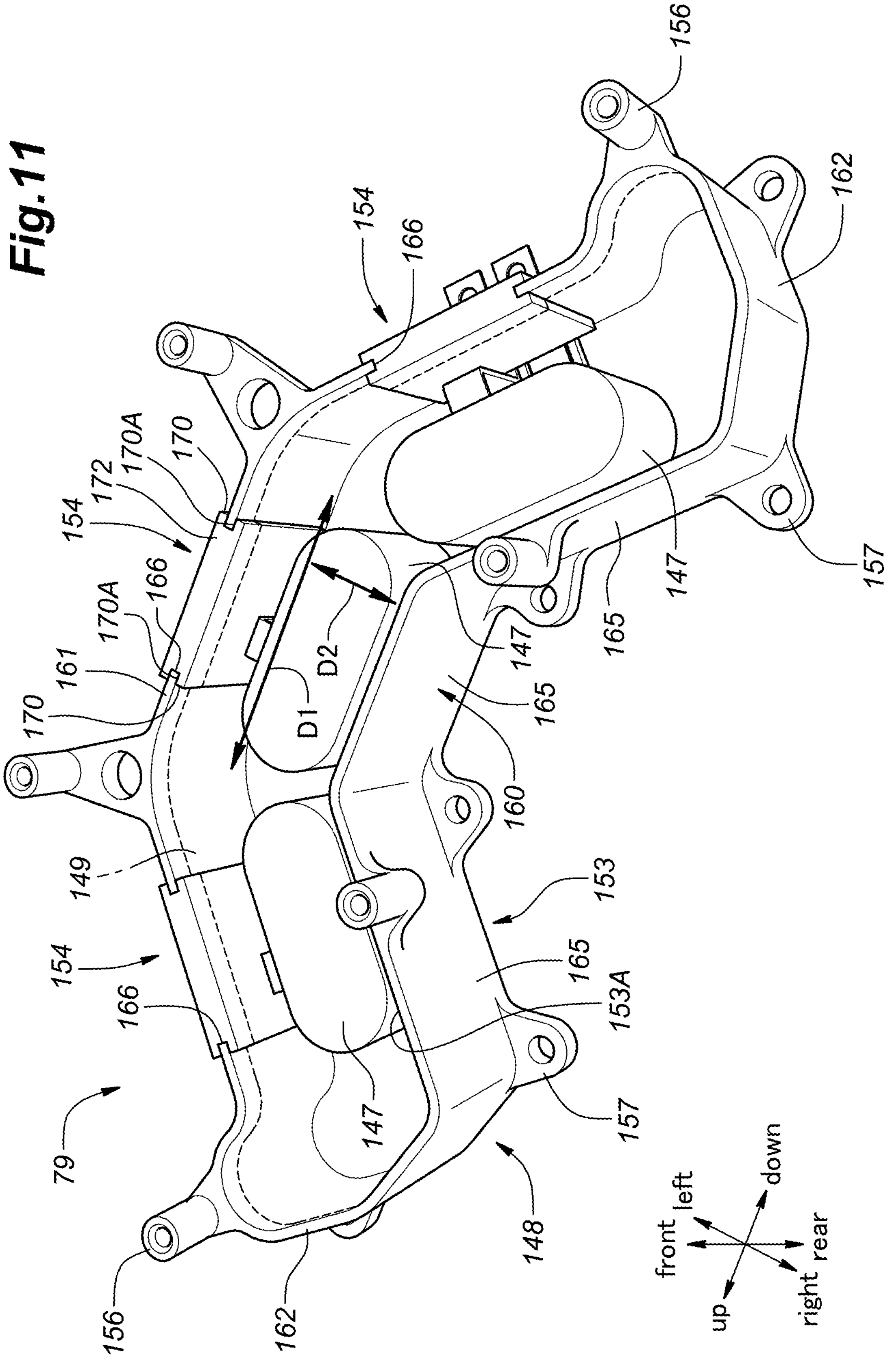
FIG. 11 is a perspective view showing the smoothing capacitor according to the embodiment.

With reference to FIGS. 7, 10 and 11, the smoothing capacitor 79 includes a plurality of capacitor elements 147 (an example of electronic components), a capacitor case 148 (an example of a case) that accommodates the plurality of capacitor elements 147, a mold material 149 (see FIG. 11) with which the inside of the capacitor case 148 is filled and that seals the plurality of capacitor elements 147, three first bus bars 150 connected to the plurality of capacitor elements 147, and three second bus bars 151 connected to the plurality of capacitor elements 147. That is, the smoothing capacitor 79 is a capacitor unit (an example of an electronic component unit) that gathers and integrates the plurality of capacitor elements 147.

The plurality of capacitor elements 147 is arranged adjacently to each other. Each capacitor element 147 has a cylindrical shape centered on an axis extending in the front-and-rear direction. That is, in the present embodiment, the axial direction of each capacitor element 147 is the front-and-rear direction.

The capacitor case 148 includes a case body 153 that supports the plurality of capacitor elements 147, three wall bodies 154 formed separately from the case body 153 and attached to the case body 153, and three holding bodies 155 (only one of which is shown in FIG. 10) formed separately from the case body 153 and the three wall bodies 154 and holding the first and second bus bars 150, 151.

The case body 153 of the capacitor case 148 is made of a metal such as aluminum. A case opening 153A is provided on the front surface (the surface on one side in the front-and-rear direction) of the case body 153. In other words, the case body 153 is a box-shaped member with the front surface opened. A plurality of support protrusions 156 is provided at the front end (one end in the front-and-rear direction) of the case body 153. A plurality of attachment protrusions 157 is provided at the rear end (the other end in the front-and-rear direction) of the case body 153. Each attachment protrusion 157 is attached to the bottom wall 94 of the casing 74 by an attachment bolt 158.

The case body 153 has a shape elongated in the circumferential direction. As viewed in the front-and-rear direction, the case body 153 is bent to protrude toward the outside in the radial direction (toward one side in the width direction of the case body 153), and is a substantially U-shaped member. The case body 153 includes an inner wall 160 extending in the circumferential direction, an outer wall 161 (an example of a wall on the one side in the width direction) extending in the circumferential direction on the outside in the radial direction of the inner wall 160, a pair of sidewalls 162 extending in the radial direction and connecting both ends of the inner wall 160 in the circumferential direction to both ends of the outer wall 161 in the circumferential direction, and a base wall 163 connecting the rear ends (the ends on the side opposite to the electric motor 31) of the inner wall 160, the outer wall 161, and the pair of sidewalls 162.

The inner wall 160 of the case body 153 rises vertically from the base wall 163. The inner wall 160 has three flat surfaces 165 formed on the inside in the radial direction of the plurality of capacitor elements 147. That is, the three flat surfaces 165 are provided at positions corresponding to the plurality of capacitor elements 147. As viewed from the front side (the side of the electric motor 31), each flat surface 165 extends along the first direction D1.

Figure 12:
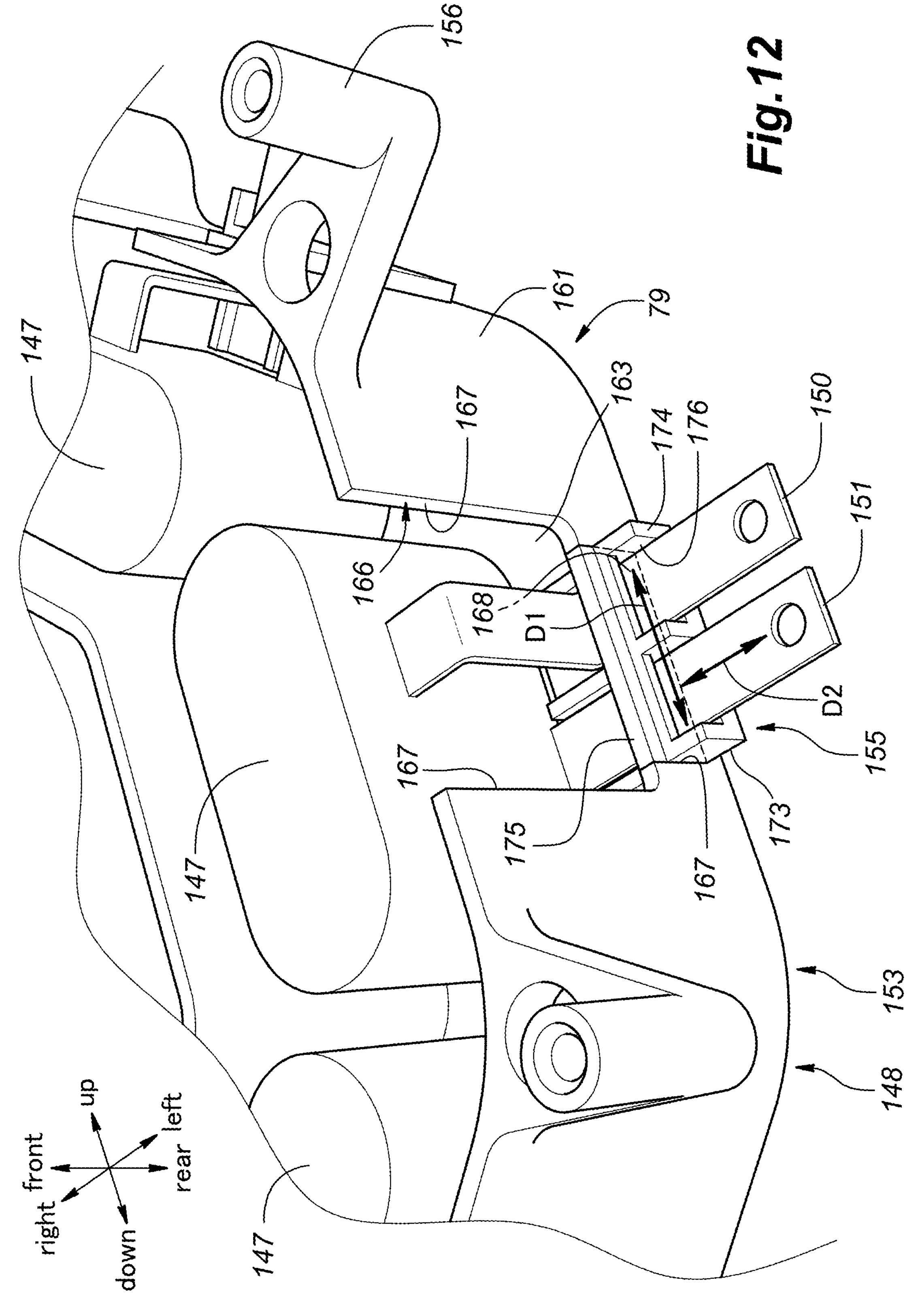
FIG. 12 is a perspective view showing a notch and its circumference according to the embodiment.

The outer wall 161 of the case body 153 rises vertically from the base wall 163. The outer wall 161 is provided with three notches 166 formed on the outside in the radial direction of the plurality of capacitor elements 147. That is, the three notches 166 are provided at positions corresponding to the plurality of capacitor elements 147. The three notches 166 are arranged at intervals in the circumferential direction (longitudinal direction of the case body 153). With reference to FIGS. 10 and 12, each notch 166 has a rectangular shape elongated in the front-and-rear direction and the first direction D1. Each notch 166 penetrates through the outer wall 161 in the radial direction (the width direction of the case body 153). Each notch 166 is continuously arranged from the front end (one end in the front-and-rear direction) of the outer wall 161 to the rear end (the other end in the front-and-rear direction) thereof. Each notch 166 includes a pair of side edges 167 extending in the front-and-rear direction, and a bottom edge 168 extending in the first direction D1 and connecting the rear ends of the pair of side edges 167. The pair of side edges 167 faces each other at a distance in the first direction D1.

With reference to FIG. 7, the base wall 163 of the case body 153 has a shape elongated in the circumferential direction. The plurality of capacitor elements 147 is placed on the front surface of the base wall 163. The rear surface of the base wall 163 contacts with the front surface (cooling surface) of the bottom wall 94 of the casing 74.

With reference to FIGS. 10 and 11, the three wall bodies 154 of the capacitor case 148 are attached to the outer wall 161 of the case body 153. The three wall bodies 154, together with the inner wall 160, the outer wall 161, and the pair of sidewalls 162 of the case body 153, define the outer shell (the portion that surrounds the plurality of capacitor elements 147 and the mold material 149) of the capacitor case 148. The three wall bodies 154 are arranged on the outside in the radial direction of the plurality of capacitor elements 147. That is, the three wall bodies 154 are provided at positions corresponding to the plurality of capacitor elements 147.

Each wall body 154 has a flat rectangular shape elongated in the front-and-rear direction and the first direction D1. That is, each wall body 154 has a shape corresponding to each notch 166 of the case body 153. Each wall body 154 engages with the corresponding notch 166 of the case body 153. Each wall body 154 is made of an insulating resin.

Each wall body 154 includes a pair of side portions 170 extending in the front-and-rear direction, a bottom portion 171 extending in the first direction D1 and connecting the rear ends of the pair of side portions 170, and a top portion 172 extending in the first direction D1 and connecting the front ends of the pair of side portions 170. A first engagement groove 170A is formed on each side portion 170 along the front-and-rear direction. The first engagement groove 170A engages with each side edge 167 of each notch 166 of the case body 153. A second engagement groove 171A is formed on the bottom portion 171 along the first direction D1. A gap G is provided between the bottom portion 171 and the bottom edge 168 of each notch 166 of the case body 153. The top portion 172 is provided flush with the front surface (the surface on one side in the front-and-rear direction) of the outer wall 161 of the case body 153.

With reference to FIGS. 10 and 12, the three holding bodies 155 (only one of which is shown in FIGS. 10 and 12) of the capacitor case 148 are attached to the outer wall 161 and the base wall 163 of the case body 153. Each holding body 155 engages with the corresponding notch 166 of the case body 153 at the rear side of the corresponding wall body 154. Each holding body 155 fills the entire gap G and surrounds the portions of the first and second bus bars 150, 151 that penetrate through the gap G. In another embodiment, each holding body 155 may fill a portion of the gap G. Each holding body 155 is formed of an insulating resin.

Each holding body 155 includes a flat base plate 173, the plurality of first ribs 174 protruding from the front surface (one surface) of the base plate 173, and a second rib 175 facing the front surface of the base plate 173 at an interval. The base plate 173 has a shape elongated in the first direction D1 and the second direction D2. The plurality of first ribs 174 is arranged at intervals in the first direction D1 and extends in the second direction D2. A plurality of holding grooves 176 is formed between the plurality of first ribs 174 on the front surface of the base plate 173. The second rib 175 extends in the first direction D1 and connects the central portions of the plurality of first ribs 174 in the second direction D2. The second rib 175 engages with the second engagement groove 171A of the bottom portion 171 of each wall body 154.

With reference to FIG. 11, the mold material 149 is made of, for example, an insulating resin. The mold material 149 entirely covers the capacitor elements 147.

Figure 13:
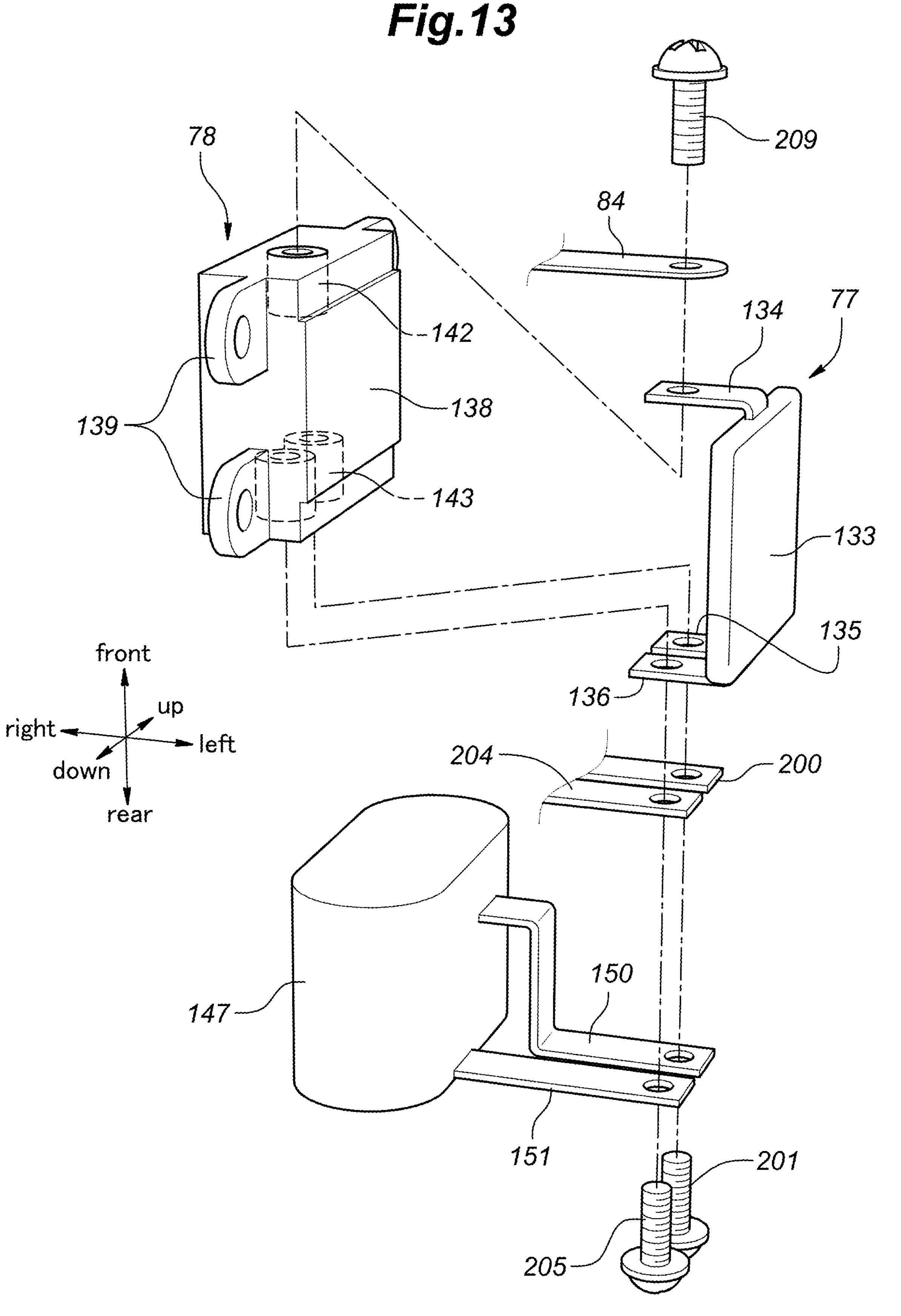
FIG. 13 is a perspective view showing an electric connection structure of the controller according to the embodiment.

With reference to FIGS. 12 and 13, the three first bus bars 150 and the three second bus bars 151 (only one of each is shown in FIGS. 12 and 13) are provided at positions corresponding to the plurality of capacitor elements 147. One of the three first bus bars 150 and one of the three second bus bars 151 gather at a position corresponding to each notch 166 of the case body 153.

With reference to FIGS. 10 and 13, each first bus bar 150 connects each capacitor element 147 to each power module 77. The end on the inside in the radial direction of each first bus bar 150 is connected to the upper portion of the side surface (the surface on the outside in the radial direction) of each capacitor element 147. Each first bus bar 150 is held by each holding groove 176 of each holding body 155 of the capacitor case 148. Each first bus bar 150 penetrates through the gap G (see FIG. 10) and extends to the rear side of each pressing member 78. The portion of each first bus bar 150 that penetrates through the gap G is surrounded by the base plate 173, the plurality of first ribs 174, and the second rib 175 of each holding body 155.

With reference to FIGS. 10 and 13, each second bus bar 151 connects each capacitor element 147 to each power module 77. The end on the inside in the radial direction of each second bus bar 151 is connected to the lower portion of the side surface (the surface on the outside in the radial direction) of each capacitor element 147. Each second bus bar 151 is held by each holding groove 176 of each holding body 155 of the capacitor case 148. Each second bus bar 151 penetrates through the gap G (see FIG. 10) and extends to the rear side of each pressing member 78. The portion of each second bus bar 151 that penetrates through the gap G is surrounded by the base plate 173, the plurality of first ribs 174, and the second rib 175 of each holding body 155.

With reference to FIG. 6, the first DC bus bar 82 includes a first main bus bar 199 extending in the circumferential direction, and three first auxiliary bus bars 200 bent from the outer circumferential portion of the first main bus bar 199 toward the rear side. One end of the first main bus bar 199 in the circumferential direction is connected to one DC input terminal 126 of the DC input connector 76. With reference to FIG. 13, the tip end of each first auxiliary bus bar 200 is bent toward the outside in the radial direction and extends to the rear side of each pressing member 78. The tip end of each first auxiliary bus bar 200, the first DC module bus bar 135 of each power module 77, and the end on the outside in the radial direction of each first bus bar 150 are fixed to one DC insert nut 143 of each pressing member 78 by a first fixing bolt 201. Accordingly, the first DC bus bar 82, each power module 77, and each first bus bar 150 are connected to each other.

With reference to FIG. 6, the second DC bus bar 83 includes a second main bus bar 203 extending in the circumferential direction, and three second auxiliary bus bars 204 bent from the outer circumferential portion of the second main bus bar 203 toward the rear side. One end of the second main bus bar 203 in the circumferential direction is connected to the other DC input terminal 126 of the DC input connector 76. With reference to FIG. 13, the tip end of each second auxiliary bus bar 204 is bent toward the outside in the radial direction and extends to the rear side of each pressing member 78. The tip end of each second auxiliary bus bar 204, the second DC module bus bar 136 of each power module 77, and the end on the outside in the radial direction of each second bus bar 151 are fixed to the other DC insert nut 143 of each pressing member 78 by a second fixing bolt 205. Accordingly, the second DC bus bar 83, each power module 77, and each second bus bar 151 are connected to each other.

With reference to FIGS. 6 and 13, one end in the longitudinal direction of each AC bus bar 84 and the AC module bus bar 134 of each power module 77 are fixed to the AC insert nut 142 of each pressing member 78 by a third fixing bolt 209. Accordingly, each AC bus bar 84 and each power module 77 are connected to each other. An AC output terminal 211 is provided at the other end in the longitudinal direction of each AC bus bar 84. That is, the controller 32 is provided with three AC output terminals 211. The three AC output terminals 211 and the pair of DC input terminals 126 are arranged in the right semicircular portion (an example of the other semicircular portion) of the casing 74. The three AC output terminals 211 are arranged at an interval in the circumferential direction from the pair of DC input terminals 126. The AC output terminals 211 are connected to the motor terminals 70 (see FIG. 4) of the stator 40 of the electric motor 31 in the internal space of the casing 74. Accordingly, as shown in FIG. 9, the alternating current output from the inverter 130 (three power modules 77) is output to each coil 69 of the electric motor 31 via each AC output terminal 211 and each motor terminal 70.

With reference to FIG. 9, the three electric current sensors 85 are arranged on three AC lines 207 (three-phase lines), respectively. The three AC lines 207 extend from the inverter 130 (three power modules 77) to each coil 69 of the electric motor 31. The three electric current sensors 85 detect the values of the electric currents output from the three power modules 77.

With reference to FIG. 6, the three electric current sensors 85 are arranged on the three AC bus bars 84, respectively. The three electric current sensors 85 are arranged in the right semicircular portion of the casing 74. The three electric current sensors 85 are arranged at intervals in the circumferential direction. The three electric current sensors 85 are fixed to a sensor holder 214 fixed to the outer circumferential portion of the bottom wall 94 of the casing 74. The sensor holder 214 is formed separately from the resolver 75.

The communication connector 86 is arranged between the pair of DC input terminals 126 and the three AC output terminals 211 in the circumferential direction. The communication connector 86 fits into the second fitting hole 117 of the bottom wall 94 of the casing 74 and penetrates through the bottom wall 94 of the casing 74. The communication connector 86 is connected to an external device (for example, a controller of the body 2) provided outside the propulsion drive device 16.

The drive board 87 is a gate drive board for driving the switching elements 128 (semiconductor elements) of the three power modules 77. The drive board 87 is arranged on the front side (the side of the electric motor 31) of the smoothing capacitor 79. The drive board 87 is supported by the plurality of support protrusions 156 provided in the case body 153 of the capacitor case 148 of the smoothing capacitor 79.

The control board 88 is an ECU board that controls driving of the inverter 130 (three power modules 77) via the drive board 87. The control board 88 is connected to the drive board 87 via a connector (not shown), and is also connected to the communication connector 86 via a cable (not shown). The control board 88 is held by a holding member (not shown) attached to the bottom wall 94 of the casing 74.

With reference to FIG. 5, the separating member 89 separates the internal space of the housing 36 from the internal space of the casing 74. The separating member 89 separates the rotor 39 and the stator 40 of the electric motor 31 from the structural components E (for example, the three power modules 77, the smoothing capacitor 79, the three electric current sensors 85, the drive board 87, and the control board 88) of the controller 32. The separating member 89 is accommodated in the casing 74. In another embodiment, the separating member 89 may be accommodated in the housing 36 of the electric motor 31. The separating member 89 has a flat plate shape along a plane perpendicular to the front-and-rear direction. An axial hole 216 is formed in the central portion of the separating member 89. The extending portion 56 of the shaft 38 penetrates through the axial hole 216.

<The Fan 33>

With reference to FIGS. 3 to 5, the fan 33 is arranged on the front side (one side in the front-and-rear direction) of the electric motor 31. The fan 33 is arranged on the side opposite to the controller 32 with the electric motor 31 interposed therebetween. The fan 33 includes a cylindrical hub 223 extending in the front-and-rear direction, a cylindrical rim 224 extending in the front-and-rear direction on the outer circumference of the hub 223, and a plurality of spokes 225 extending in the radial direction and connecting the hub 223 and the rim 224. The hub 223 is fixed to the protruding portion 57 of the shaft 38 of the electric motor 31. Accordingly, the fan 33 is configured to rotate integrally with the shaft 38. A plurality of air blowing ribs 226 is provided on the outer circumferential surface of the rim 224 at intervals in the circumferential direction of the rim 224. Each air blowing rib 226 inclines forward (to one side in the front-and-rear direction) toward the downstream side in the rotational direction R of the fan 33.

<The Duct Cover 34>

With reference to FIGS. 3 and 5, the duct cover 34 has a cylindrical shape extending in the front-and-rear direction. A cooling air passage 229 is formed between the duct cover 34 and both the housing 36 of the electric motor 31 and the circumferential wall 93 of the casing 74 of the controller 32. That is, the cooling air passage 229 is formed on the outer circumference of the housing 36 of the electric motor 31 and the casing 74 of the controller 32. The cooling air passage 229 is cylindrical and extends in the front-and-rear direction.

<Cooling of the Electric Motor 31 and The Controller 32>

With reference to FIGS. 3 and 5, when the electric motor 31 is driven and the shaft 38 rotates, the fan 33 fixed to the protruding portion 57 of the shaft 38 rotates integrally with the shaft 38. Accordingly, the cooling air is blown by the plurality of air blowing ribs 226 of the fan 33 toward the outer circumferential surface of the housing 36 and the outer circumferential surface of the circumferential wall 93 of the casing 74. That is, the cooling air is introduced into the cooling air passage 229 by the plurality of air blowing ribs 226 of the fan 33.

The cooling air introduced into the cooling air passage 229 flows on the outer circumference of the housing 36 and between the plurality of first cooling fins 42 from the front side to the rear side. Accordingly, the electric motor 31 is cooled by the cooling air. Next, the cooling air flows on the outer circumference of the circumferential wall 93 of the casing 74 and between the plurality of second cooling fins 96 from the front side to the rear side. Accordingly, the casing 74 of the controller 32 is cooled by the cooling air. The cooling air that has passed through the outer circumference of the circumferential wall 93 of the casing 74 is discharged from the rear end of the cooling air passage 229 to the space behind the controller 32.

<The Manufacturing Method of the Smoothing Capacitor 79>

Next, an example of the manufacturing method of the smoothing capacitor 79 will be described. In the present embodiment, a case where an operator manufactures the smoothing capacitor 79 will be described. In another embodiment, a manufacturing device (not shown) may manufacture the smoothing capacitor 79, or the operator and the manufacturing device may manufacture the smoothing capacitor 79 together.

First, the operator arranges the case body 153 such that the case opening 153A faces upward, and places the plurality of capacitor elements 147 on the case body 153.

With reference to FIG. 12, next, the operator engages each holding body 155 holding the first bus bar 150 and the second bus bar 151 with each notch 166 of the case body 153, thereby placing the first bus bar 150 and the second bus bar 151 on the case body 153 such that the first bus bar 150 and the second bus bar 151 cross each notch 166.

With reference to FIG. 10, next, the operator engages each wall body 154 with each notch 166 of the case body 153 such that the first bus bar 150 and the second bus bar 151 penetrate through the gap G. Next, the operator fills, with a viscous adhesive (not shown), the gap between each holding body 155 and both the first bus bar 150 and the second bus bar 151, the gap between each wall body 154 and each holding body 155, and the gap between each notch 166 of the case body 153 and both each wall body 154 and each holding body 155.

With reference to FIG. 11, next, the operator seals the plurality of capacitor elements 147 with the mold material 149 by filling the inside of the capacitor case 148 with the mold material 149. At this time, since the gaps between the components are filled with the viscous adhesive (not shown) as described above, the mold material 149 is prevented from leaking out of the capacitor case 148.

<Effects>

In the smoothing capacitor 79 according to the present embodiment, the first and second bus bars 150, 151 penetrate through the gap G of the capacitor case 148, so that the first and second bus bars 150, 151 can be pulled out through the gap G of the capacitor case 148. Accordingly, as compared to a case where the first and second bus bars 150, 151 bypass the capacitor case 148, the first and second bus bars 150, 151 can be shorter and lighter. Further, by adjusting the position of the gap G of the capacitor case 148, it is possible to pull out the first and second bus bars 150, 151 from a desired position of the capacitor case 148. Accordingly, the flexibility of the connection position between the first and second bus bars 150, 151 and the plurality of power modules 77 arranged outside the capacitor case 148 can be improved.

Further, the first and second bus bars 150, 151 are shortened as described above, so that the distance between the plurality of capacitor elements 147 and the three power modules 77 can be shortened. Accordingly, an increase in the inductance of the inverter 130 composed of the switching elements 128 of the three power modules 77 can be suppressed.

Further, in the manufacturing method of the smoothing capacitor 79 according to the present embodiment, the first bus bar 150 and the second bus bar 151 are placed on the case body 153 before the wall body 154 engages with the notch 166 of the case body 153. Accordingly, it is possible to easily place the first bus bar 150 and the second bus bar 151 on the case body 153 while checking the positions of the first bus bar 150 and the second bus bar 151. Accordingly, the manufacture of the smoothing capacitor 79 can be facilitated.

Further, since the plurality of capacitor elements 147 is gathered and integrated, it is possible to complete the manufacture of the smoothing capacitor 79 by performing the filling operation of the mold material 149 once to harden the mold material 149. Accordingly, as compared to a case of performing the filling operation of the mold material 149 plural times to manufacture the smoothing capacitor 79, the manufacturing process of the smoothing capacitor 79 can be simplified, and the manufacturing time of the smoothing capacitor 79 can be shortened.

<Modifications>

In the above embodiment, the plurality of capacitor elements 147 is an example of a plurality of electronic components. In another embodiment, the components other than the plurality of capacitor elements 147 (for example, the plurality of power modules 77 or a plurality of boosting reactors (not shown)) may be an example of a plurality of electronic components.

In the above embodiment, the plurality of notches 166 is formed in the outer wall 161 of the case body 153. In another embodiment, the plurality of notches 166 may be formed in the wall (for example, the inner wall 160 or the pair of sidewalls 162) other than the outer wall 161 of the case body 153.

In the above embodiment, the plurality of notches 166 is formed in the case body 153. In another embodiment, only one notch 166 may be formed in the case body 153.

In the above embodiment, the electric motor 31 of an inner rotor type is an example of a rotary electric machine. In another embodiment, an electric motor of an outer rotor type may be an example of the rotary electric machine, or a generator may be an example of the rotary electric machine.

In the above embodiment, the configuration of the present invention is applied to the propulsion drive device 16. In another embodiment, the configuration of the present invention may be applied to the lift drive device 12.

In the above embodiment, the configuration of the present invention is applied to an electric vertical take-off and landing aircraft. In another embodiment, the configuration of the present invention may be applied to an aircraft other than an electric vertical take-off and landing aircraft (i.e., a general aircraft that cannot take off and land vertically), or the configuration of the present invention may be applied to a mobile body other than an aircraft (for example, a vehicle such as an automobile or a motorcycle). Further, in another embodiment, the configuration of the present invention may be applied to a device that is fixedly installed.

This concludes the description of the specific embodiments, but the present invention is not limited to the above embodiments or modifications, and can be widely modified and implemented.

The invention claimed is:

1. An electronic component unit that integrates a plurality of electronic components, the electronic component unit comprising:

a plurality of electronic components;

a case that accommodates the plurality of electronic components;

a mold material with which an inside of the case is filled and that seals the plurality of electronic components; and at least one bus bar connected to each of the electronic components, wherein the case includes:

a case body that supports the plurality of electronic components; and at least one wall body formed separately from the case body and attached to the case body, and the bus bar penetrates through a gap between the case body and the wall body.

2. The electronic component unit according to claim 1, wherein the case body is provided with a notch, and the wall body has a shape corresponding to the notch and engages with the notch.

3. The electronic component unit according to claim 2, wherein the at least one bus bar comprises a plurality of bus bars arranged to gather at a position corresponding to the notch, the notch includes:

a pair of side edges facing each other; and a bottom edge connecting the pair of side edges, the wall body includes:

a pair of side portions that engages with the pair of side edges; and a bottom portion connecting the pair of sides portions, and the plurality of bus bars penetrates through the gap between the bottom edge and the bottom portion.

4. The electronic component unit according to claim 1, wherein the case further includes a holding body formed separately from the case body and the wall body and holding the bus bar, and the holding body fills at least a portion of the gap and surrounds a portion of the bus bar that penetrates through the gap.

5. The electronic component unit according to claim 4, wherein the holding body includes:

a flat base plate;

a plurality of first ribs protruding from one surface of the base plate and arranged at an interval in a first direction; and a second rib facing the one surface of the base plate at an interval, extending in the first direction, and connecting the plurality of first ribs, and the base plate, the plurality of first ribs, and the second rib surround the portion of the bus bar that penetrates through the gap.

6. The electronic component unit according to claim 5, wherein the plurality of first ribs extends in a second direction perpendicular to the first direction, and a holding groove that holds the bus bar is formed between the plurality of first ribs on the one surface of the base plate.

7. The electronic component unit according to claim 5, wherein an engagement groove is formed on the wall body along the first direction, and the second rib engages with the engagement groove.

8. The electronic component unit according to claim 1, wherein the at least one wall body comprises a plurality of wall bodies provided at positions corresponding to the plurality of electronic components, and the at least one bus bar comprises a plurality of bas bars provided at the positions corresponding to the plurality of electronic components, and each of the bas bars penetrates through the gap between the case body and each of the wall bodies.

9. The electronic component unit according to claim 8, wherein the plurality of electronic components each has a cylindrical shape and is arranged adjacently to each other, the case body is bent to protrude toward one side in a width direction of the case body as viewed in an axial direction of the plurality of electronic components, and the plurality of wall bodies is attached to a wall of the case body on the one side in the width direction of the case body.

10. A manufacturing method of an electronic component unit, the electronic component unit comprising:

a plurality of electronic components;

at least one bus bar connected to each of the electronic components; and a case that accommodates the plurality of electronic components and includes:

a case body provided with a notch; and at least one wall body engaging with the notch, the manufacturing method comprising the sequential steps of:

placing the bus bar on the case body such that the bus bar crosses the notch, engaging the wall body with the notch such that the bus bar penetrates through a gap between the notch and the wall body, and sealing the plurality of electronic components with a mold material by filling an inside of the case with the mold material.

* * * * *